United States Patent [19]

Aspesi et al.

[11] Patent Number: 5,543,779
[45] Date of Patent: Aug. 6, 1996

[54] EMI SOURCE DETECTOR

[76] Inventors: Marc S. Aspesi, 39 Daffodil Dr., Farmingdale, N.Y. 11735; Steven T. Nakata, 60 Farm River Rd., Short Beach, Conn. 06405

[21] Appl. No.: 401,118

[22] Filed: Mar. 9, 1995

[51] Int. Cl.$^6$ .................................................. G08B 1/08
[52] U.S. Cl. ............................ 340/539; 455/1; 455/67.3; 455/134
[58] Field of Search ................. 340/539, 1; 455/67.3, 455/134, 161.3, 135

[56] References Cited

U.S. PATENT DOCUMENTS

| | | | |
|---|---|---|---|
| 4,965,548 | 10/1990 | Fayfield | 455/134 |
| 5,119,018 | 6/1992 | Katayama et al. | 324/77 |

*Primary Examiner*—John K. Peng
*Assistant Examiner*—Daryl C. Pope
*Attorney, Agent, or Firm*—Victor M. Serby

[57] ABSTRACT

A scanning radio receiver for indicating the presence of operating consumer electronics by detecting the electromagnetic radiation at each scanned frequency is disclosed. The detected field strength at the antenna at each scanned frequency is compared to a first threshold of 20 μv/m from 400 KHz to 88 MHz, 30 μv/m from 88+ MHz to 216 MHz, and 40 μv/m from 216+ MHz to 918 MHz and a first alarm is sounded should the detected field strength exceed this first threshold. The detected field strength at the antenna at each scanned frequency is also compared to a second threshold of 1 mv/m and a second alarm, distinct from the first is sounded should the detected field strength exceed this second threshold. This device is useful for detecting the unauthorized operation of electronic equipment in the vicinity of mission critical or life support electronics which may be susceptible to consumer electronics generated EMI.

2 Claims, 3 Drawing Sheets

5,543,779

EMI SOURCE DETECTOR

BACKGROUND OF THE INVENTION

This invention is concerned with devices for detecting the presence of operating consumer electronic equipment, where such operation by radiating electromagnetic emissions, may interfere with electronic equipment that is mission critical, or used for life support.

Unauthorized use of consumer electronic equipment on airlines, in hospitals and in other areas where potential for interference with flight instrumentation and controls, or life support equipment is an ever increasing problem. For example, in early 1993, a DC-10 on approach to Kennedy Airport in New York, suddenly veered out of its flight pattern. Many believe that the cause of this near tragedy was electromagnetic interference (EMI) from a CD player interfering with the aircraft's navigation system. The use of portable electronic equipment in hospitals has too proved to interfere with infusion pumps and other susceptible medical devices.

The FAA in its regulations (US FAR 91.21) bars the use of any portable electronic device on US registered civil aircraft with certain listed exceptions and exceptions allowed by the operator of the aircraft. Cellular telephones and other active transmitters are banned altogether; however, laptop computers, CD players, calculators and all other electronic equipment are banned only when the plane is in takeoff or landing.

Although the radiated emission limits of consumer electronic equipment (unintentional radiators) must generally fall within the values prescribed in 47 CFR Section 15 Subpart B, particularly 47 CFR §15.109, usually only a small number of samples of the equipment are tested for certification or verification. Improper manufacture, improper repair, physical damage and the like, can cause a particular piece of consumer electronic equipment to radiate at orders of magnitude above its maximum specified value, and EMI generated by such non-conforming equipment could interfere with the proper operation of aircraft navigation and control systems, or critical life support systems dependent on electronics for their operation.

All avionic equipment on civil aircraft must meet the minimum EMI susceptibility requirements as set forth in specification RTCA/DO-160C (Radio Technical Commission for Aeronautics). FIG. 20-6 of said specification shows that Category T equipment must survive an applied field of 5 v/m from 500 KHz to 400 MHz and rolling off to 0.1 v/m at 10 KHz at 1.0 db/octave. It is possible, that an operating piece of portable equipment (unintentional radiator) taken onto an aircraft will interfere with the more susceptible cockpit instrumentation. Certainly intentional radiators such as CB radios, cellular telephones, pagers, and remote control toys have the ability to interfere with navigation equipment. In contrast, EMI susceptibility design and testing of medical equipment is almost non-existent so that even an FCC conforming class B unintentional radiator may have detrimental consequences on this equipment and the patient dependent upon it.

Prior art related to this invention includes U.S. Pat. No. 4,887,086 titled "Combined Scanner and Radar Detector." Unser et al. use a scanner to detect the presence of transmissions (intentional fixed frequency radiators) on certain FCC allocated radio frequencies and then sound an alarm if any of said frequencies are detected. In U.S. Pat. No. 5,086,300 titled "Method and System for Passive Detection of EM Events," Ashmore discloses a system which is useful for indicating the presence of an electronic fuzing device (unintentional radiator) in aircraft luggage by detecting its electromagnetic emissions.

What is needed is a device which detects the EMI radiated from portable electronic equipment and alerts airline personnel of the presence of such an operating device before it becomes a hazard to the operation of the aircraft without giving off false alarms. Similarly, hospitals need such a device to alert the proper personnel of the presence of devices which may interfere with medical electronics. However in each of these cases the radiation to be detected is not confined to fixed frequencies as in the case of Unser, nor is it fixed to the lower threshold of detection as in the case of Ashmore.

SUMMARY OF INVENTION

It is an object of this invention to provide apparatus for detecting the presence of EMI which could cause the improper operation or cause malfunction of electrical, electronic or electromagnetic equipment.

The present invention is a scanning radio receiver having preset or user adjustable detection thresholds over a bandwidth of 400 KHz to 900 MHz which trigger an alarm should a received signal exceed the threshold set at any frequency. The threshold values at each frequency for the receiver are selected to detect the presence of operating portable consumer electronic equipment without causing false alarms.

The invention is also a new use of a scanning radio receiver having preset or user adjustable detection thresholds to detect the presence of EMI emitters in the proximity of mission critical or life support electronic equipment.

DESCRIPTION OF PREFERRED EMBODIMENT

Figure 1:
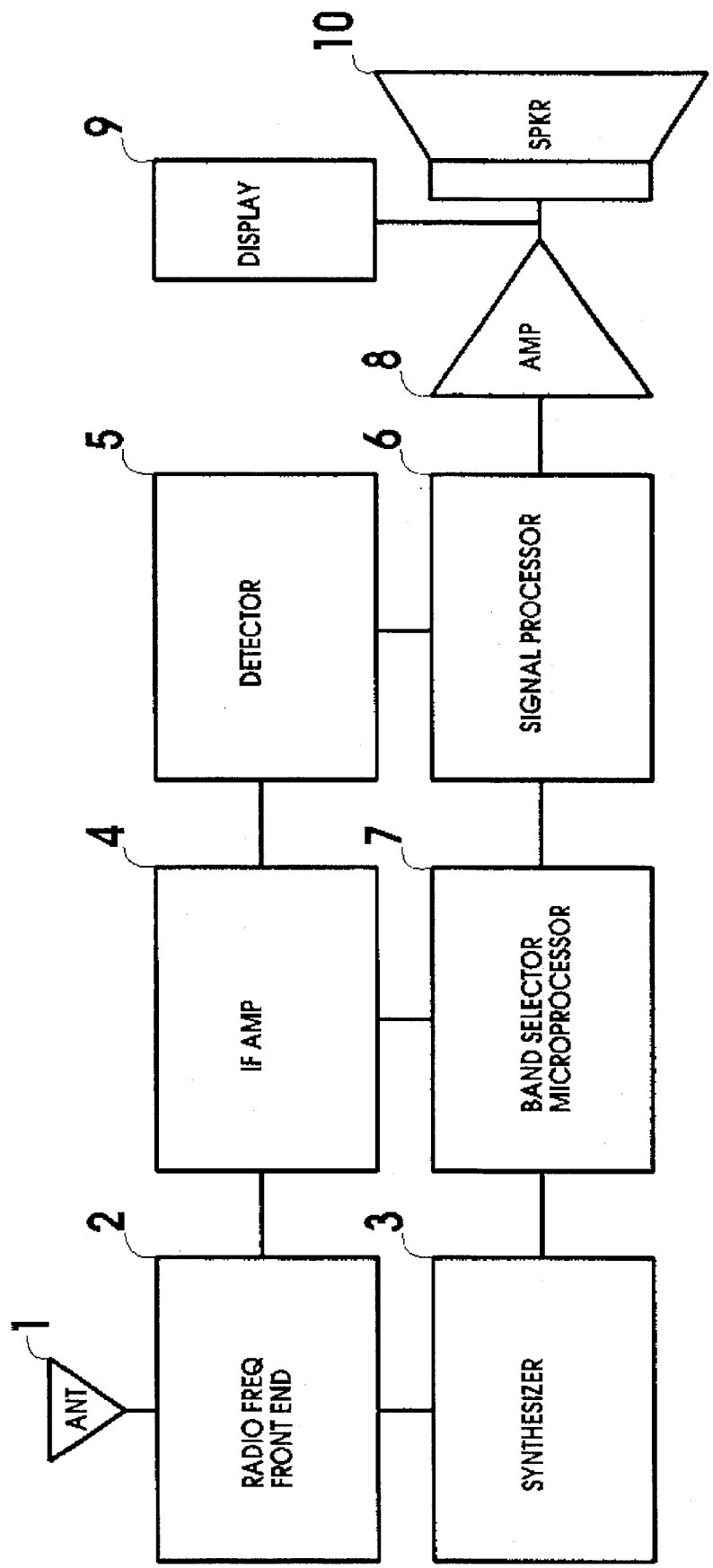
FIG. 1 is a block diagram of the functional elements of the invention indicating their operable relationship for the portable EMI detection device.
Figure 2:
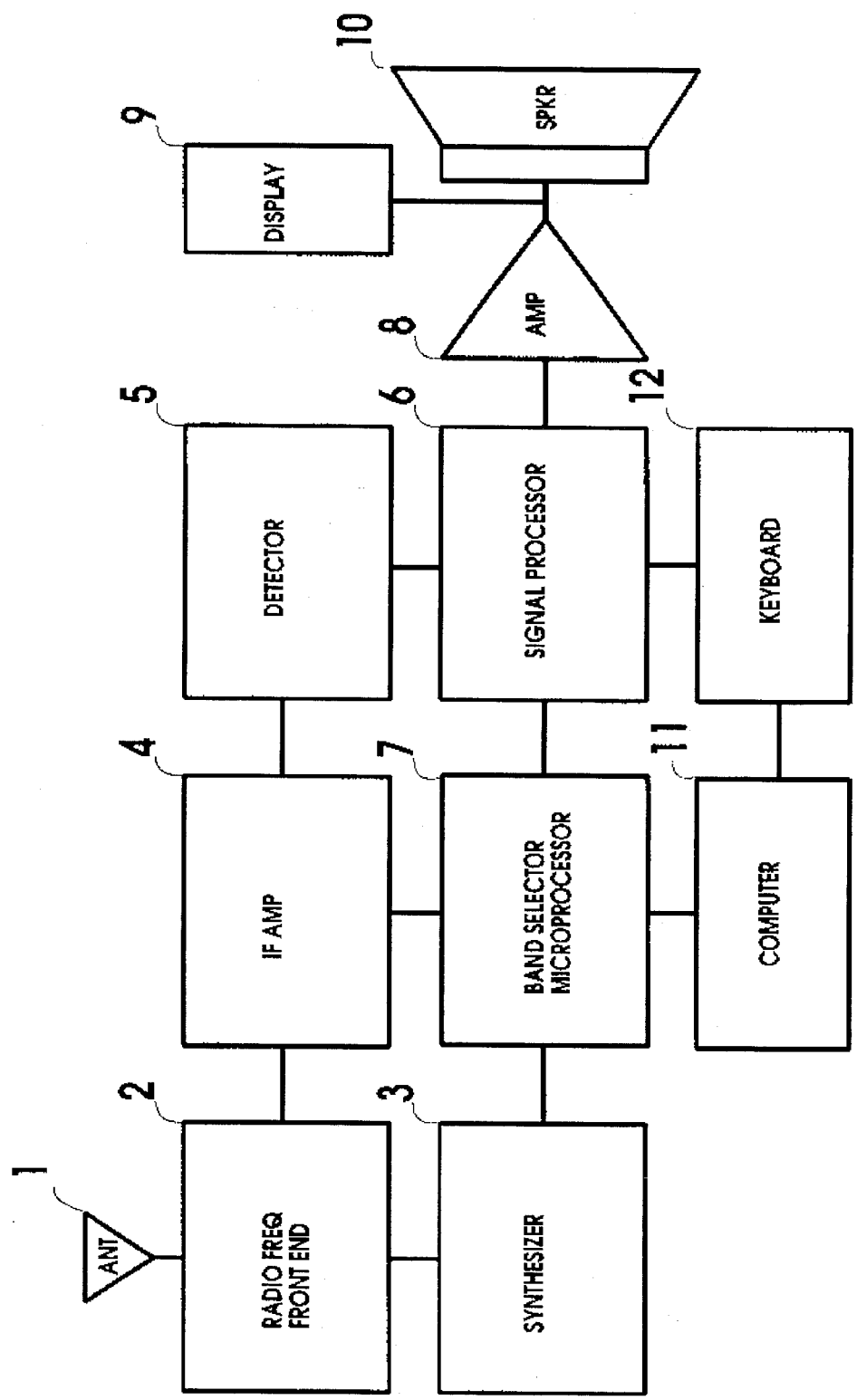
FIG. 2 is a block diagram of the functional elements of the invention indicating their operable relationship for the stationary EMI detection device.

Referring to FIG. 1, antenna (1) receives input RF signals and conducts them to RF amplifier front end (2). RF amplifier (2) has a band coverage of 400 KHz to 918 MHz. Microprocessor (7) controls the operation of the synthesizer (3) including the sweep rate which is preferably logarithmic between the two stated frequency extremes stated supra. The converted output from RF front end (2) is fed to the intermediate frequency circuit (4) and is detected by detector circuit (5). The output from the detector circuit (5) is fed to signal processor (6). The signal processor supplies a feedback input to microprocessor (7) and an input to amplifier (8). Amplifier (8) drives both a visual and an audible first alarm represented by display (9) and speaker (10) respectively. Amplifier (8) also drives a second alarm which may be the same physical display (9) and speaker (10), however the second alarm signal is distinct from the first. Referring to FIG. 2, a computer (11) may be incorporated for stationary applications to compare the received frequency spectrum with spectra stored in memory to determine the nature and type of the radiating device. The computer may also be used as a means to program the alarm threshold through keyboard (12) at each frequency (alarm threshold spectrum) should any adjustments be needed during actual use.

Figure 3:
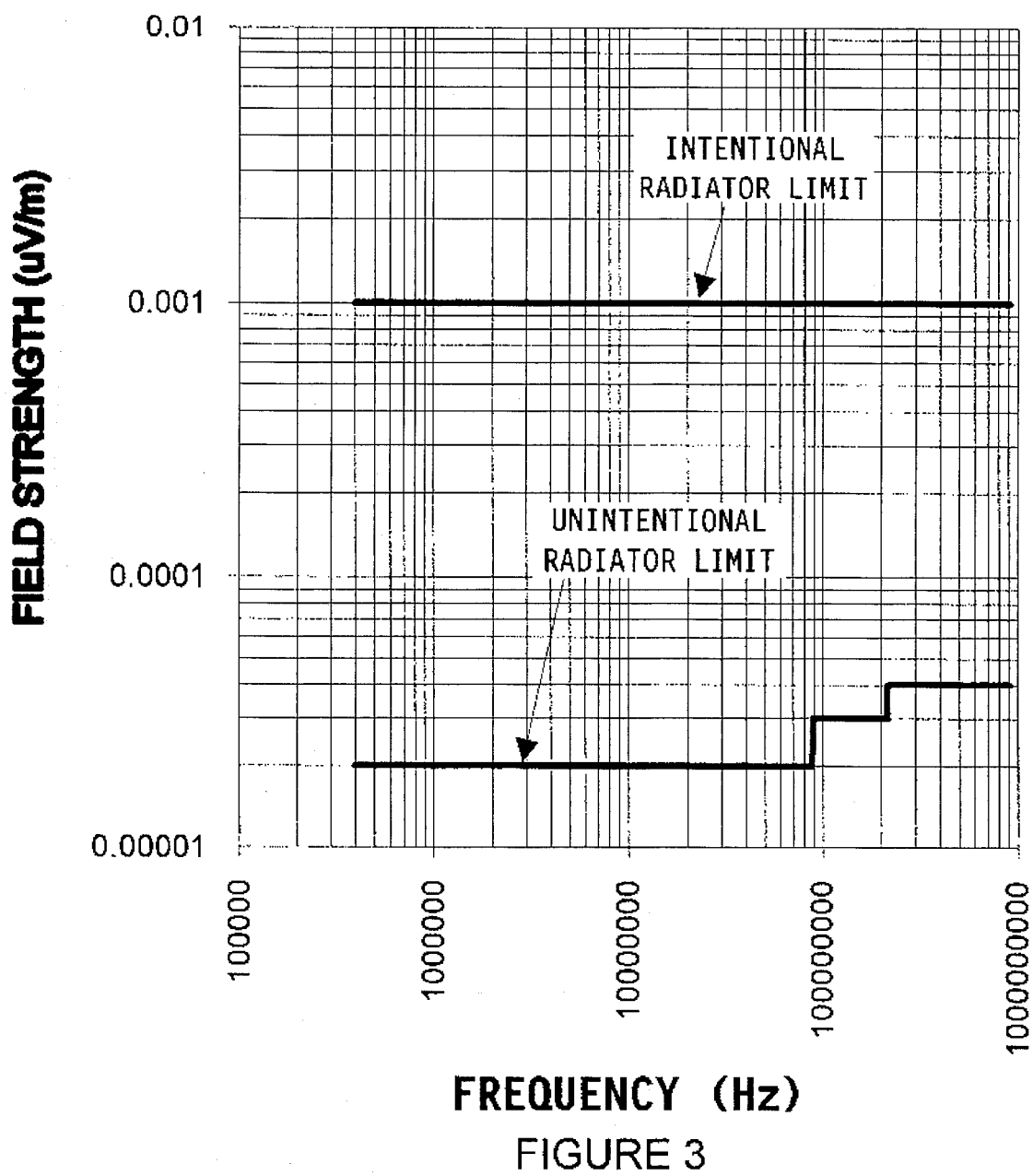
FIG. 3 shows the preferred detection alarm thresholds for this invention.

For on-board civil aircraft applications, the detection threshold for the portable device should be set to trigger an alarm warning should the field strength at the antenna exceed about 20 μv/m from 400 KHz to 88 MHz, about 30 μv/m from 88+ MHz to 216 MHz, and about 40 μv/m from 216+ MHz to 918 MHz (see FIG. 3). This will adequately detect the presence of unintentional radiators in this bandwidth without yielding false alarms. Provisions may be made for a second alarm threshold and a distinct second alarm warning when a field strength of greater than about 1 mv/m is detected (see FIG. 3). This second alarm warning could be a different audio tone or a different color visual indicator. Such a high field strength is indicative of an intentional radiator or an improperly shielded unintentional radiator which must be turned off because of the probability of causing EMI with the flight avionics. An additional feature of this device may be a multiple array receiving antenna so that the signals received may be processed, and an exact location of the radiating source displayed on a computer screen.

The portable device may be used by flight attendants during their routine cabin activities to advise them of the presence of operating electronic equipment and to enforce the airline's and FAA rules with respect to the operation of such equipment aboard civil aircraft. The presence of any alarm during takeoff and landing, or the presence of the second alarm at any time would indicate the need for corrective action (locating the source and turning it off) to ensure aircraft safety.

This device may also be used in hospitals to detect the presence and warn hospital personnel of EMI emitting consumer electronics which may interfere with the proper operation of life support systems, infusion pumps and other medical electronics so that the offending consumer electronics may be located and corrective action may be taken before life or health is jeopardized. Also, individuals who depend upon life-support systems or motorized apparatus such as artificial limbs or wheelchairs can use a portable EMI detector to detect emmissions from consumer electronics or other radiators to alert them to potentially hazardous interference.

The electromagnetic emissions from the detection device itself must not be overlooked. Each detection device must be checked for EM emissions to ensure that it will not be the cause of interference with the equipment it was designed to protect.

Although a specific preferred embodiment of the present invention has been described in detail above, it is readily apparent that those skilled in the art and science may make various modifications and changes to the present invention without departing from the spirit and scope thereof. These changes include but are not limited to substitution of equivalents, addition of elements, or incorporation of the invention as a feature of other equipment. It is to be expressly understood that this invention is limited by the following claims:

We claim:

1. An EMI detector comprising:

a) a radio receiver having an antenna for receiving an RF signal, said receiver having a band coverage from about 40 KHz to about 918 MHz, said radio receiver further comprising means for swept tuning of said receiver from about 40 KHz to about 916 MHz, wherein the improvement comprises:

b) a first alarm switchable between an on state and an off state, said first alarm switching to said on state in response to said antenna receiving an RF signal which exceeds about 20 μv/m from 400 KHz to 88 MHz, about 30 μv/m from 88+ MHz to 216 MHz, and about 40 μv/m from 216+ MHz to 918 MHz; and c) a second alarm switchable between an on state and an off state, said second alarm switching to said on state in response to said antenna receiving an RF signal which exceeds about 1 mv/m.

2. The EMI detector of claim 1 further comprising a computer with display means, said computer having pre-stored emissions spectra of consumer electronics, each of said pre-stored emissions spectra pre-identified with a type of consumer electronics, said computer storing a frequency spectrum of said received RF signal, said computer comparing said frequency spectrum to each of said pre-stored emissions spectra and displaying the type of consumer electronics corresponding to a pre-stored spectrum if said frequency spectrum matches that pre-stored spectrum.

* * * * *